United States Patent
Khaja et al.

(10) Patent No.: US 9,466,469 B2
(45) Date of Patent: Oct. 11, 2016

(54) REMOTE PLASMA SOURCE FOR CONTROLLING PLASMA SKEW

(71) Applicant: Applied Materials, Inc., Santa Clara, CA (US)

(72) Inventors: Abdul Aziz Khaja, San Jose, CA (US); Mohamad A. Ayoub, Los Gatos, CA (US); Ramesh Bokka, Milpitas, CA (US); Jay D. Pinson, II, San Jose, CA (US); Juan Carlos Rocha-Alvarez, San Carlos, CA (US)

(73) Assignee: APPLIED MATERIALS, INC., Santa Clara, TX (US)

( * ) Notice: Subject to any disclaimer, the term of this patent is extended or adjusted under 35 U.S.C. 154(b) by 0 days.

(21) Appl. No.: 15/068,690

(22) Filed: Mar. 14, 2016

(65) Prior Publication Data

US 2016/0268103 A1     Sep. 15, 2016

Related U.S. Application Data

(60) Provisional application No. 62/133,160, filed on Mar. 13, 2015.

(51) Int. Cl.
  *H01J 37/32*     (2006.01)

(52) U.S. Cl.
  CPC ...... *H01J 37/32458* (2013.01); *H01J 37/3211* (2013.01)

(58) Field of Classification Search
  CPC ............. H01J 37/321; H01J 37/32357; H01J 37/32155; H01J 37/3211; H01J 37/32458
  USPC ............. 315/111.01, 111.21, 111.41, 111.51, 315/111.71
  See application file for complete search history.

(56) References Cited

U.S. PATENT DOCUMENTS

| | | | |
|---|---|---|---|
| 6,815,899 B2 * | 11/2004 | Choi | H01J 37/32357 315/111.21 |
| 7,161,112 B2 | 1/2007 | Smith et al. | |
| 7,166,816 B1 | 1/2007 | Chen et al. | |
| 7,569,790 B2 | 8/2009 | Holber et al. | |
| 7,659,489 B2 | 2/2010 | Holber et al. | |
| 7,969,096 B2 | 6/2011 | Chen | |
| 8,124,906 B2 | 2/2012 | Holber et al. | |
| 8,633,782 B2 | 1/2014 | Nagarkatti et al. | |
| 8,653,405 B2 | 2/2014 | Kirchmeier et al. | |
| 8,742,665 B2 | 6/2014 | Lubomirsky et al. | |
| 8,771,538 B2 | 7/2014 | Lubomirsky et al. | |
| 9,305,749 B2 | 4/2016 | Ye et al. | |
| 2010/0025230 A1 | 2/2010 | Ehiasarian et al. | |
| 2010/0098882 A1 | 4/2010 | Lubomirsky et al. | |
| 2011/0045676 A1 | 2/2011 | Park et al. | |

(Continued)

*Primary Examiner* — Thai Pham
(74) *Attorney, Agent, or Firm* — Patterson & Sheridan, LLP

(57) ABSTRACT

A plasma source is provided including a core element extending from a first end to a second end along a first axis. The plasma source further includes one or more coils disposed around respective one or more first portions of the core element. The plasma source further includes a plasma block having one or more interior walls at least partially enclosing an annular plasma-generating volume that is disposed around a second portion of the core element. The annular plasma-generating volume includes a first region that is symmetrical about a plurality of perpendicular axes that are perpendicular to a first point positioned on the first axis, the first region having a width in a direction parallel to the first axis and a depth in a direction perpendicular from the first axis. The first region has a width that is at least three times greater than the depth of the first region.

20 Claims, 6 Drawing Sheets

(56) References Cited

U.S. PATENT DOCUMENTS

| | | | |
|---|---|---|---|
| 2011/0114601 A1* | 5/2011 | Lubomirsky | H01J 37/3211 216/68 |
| 2014/0216923 A1 | 8/2014 | Miller | |
| 2015/0228456 A1* | 8/2015 | Ye | H01J 37/3211 315/111.51 |
| 2016/0020071 A1 | 1/2016 | Khaja et al. | |
| 2016/0086772 A1 | 3/2016 | Khaja et al. | |

* cited by examiner

REMOTE PLASMA SOURCE FOR CONTROLLING PLASMA SKEW

CROSS-REFERENCE TO RELATED APPLICATIONS

This application claims priority to U.S. Provisional Patent Application Ser. No. 62/133,160, filed on Mar. 13, 2015, which herein is incorporated by reference.

BACKGROUND

1. Field

Embodiments disclosed herein generally relate to plasma processing systems and materials and apparatus for controlling plasma uniformity in plasma processing systems.

2. Description of the Related Art

Plasma processing chambers are regularly utilized in various electronic device fabrication processes, such as etching processes, chemical vapor deposition (CVD) processes, and other processes related to the manufacture of electronic devices on substrates. However, sometimes it is not desirable or cost effective to generate a plasma in the chamber processing the substrate. In such cases, a remote plasma source (RPS) can be used.

Conventional RPS designs traditionally use a closed loop RF source configuration having windings that are wrapped around a closed magnetically permeable core that surrounds a portion of the plasma-generating region. Recently, open loop RF source configurations have been developed. The open loop RF source configurations use an annular processing volume surrounding a magnetically permeable core, such as a magnetically permeable linear rod, with windings wrapped around the magnetically permeable core. Open loop designs have the advantage of being able to create a plasma 360 degrees around the magnetically permeable core, which can increase efficiencies relative to closed loop designs.

Although the open loop design has advantages, obtaining targets for plasma uniformity can be challenging. For example, in open loop designs using an annular plasma chamber surrounding a linear magnetically permeable core that extends in a first horizontal direction, the plasma density in the RPS can have one or more peaks that are skewed in that first horizontal direction. When the plasma density is not centered or uniform across the horizontal direction relative to center of the annular plasma chamber, then the plasma-containing or radical containing gas will not be uniformly supplied to the process chamber, which creates non-uniformities in the process results achieved on the substrate being processed in the process chamber. Furthermore, when minor adjustments to the configuration of the RPS hardware are made, such as adjustments to the coil position relative to the plasma chamber, dramatic shifts in the uniformity of the plasma density in horizontal directions are often observed.

Therefore, there is a need for an open loop RF source configuration that improves the plasma uniformity in the plasma chamber.

SUMMARY

Embodiments disclosed herein generally relate to plasma processing systems and materials and apparatus for controlling plasma uniformity in plasma processing systems. In one embodiment, a plasma source coupled to a process chamber is provided. The plasma source includes a core element extending from a first end to a second end along a first axis. The plasma source further includes one or more coils disposed around respective one or more first portions of the core element. The plasma source further includes a plasma block having one or more interior walls at least partially enclosing an annular plasma-generating volume that is disposed around a second portion of the core element. The annular plasma-generating volume includes a first region that is symmetrical about a plurality of perpendicular axes that are perpendicular to the first axis at a first point positioned along the first axis, the first region having a width in a direction parallel to the first axis and a depth in a direction perpendicular from the first axis. The width in the first region increases as the depth from the first point positioned on the first axis increases. The first region has a central point located at an intersection of one of the perpendicular axes and an interior wall, wherein the central point is a first depth from the first point positioned on the first axis. The first region further has a first width between a first location and a second location on one or more of the interior walls, wherein the first width is parallel to the first axis and the first width is a second depth from the first point positioned on the first axis. The first region has a third depth spanning a distance between the second depth and the first depth, wherein the first width is at least three times greater than the third depth.

In another embodiment, a plasma source coupled to a process chamber is provided. The plasma source includes a core element extending from a first end to a second end along a first axis. The plasma source further includes one or more coils disposed around respective one or more first portions of the core element. The plasma source further includes a plasma block having one or more interior walls at least partially enclosing an annular plasma-generating volume that is disposed around a second portion of the core element. The annular plasma-generating volume includes a first region that is symmetrical about a plurality of perpendicular axes that are perpendicular to the first axis at a first point positioned along the first axis, the first region having a width in a direction parallel to the first axis and a depth in a direction perpendicular from the first axis. The first region is defined by a curved surface extending from a first location to a second location on one of the interior walls and a boundary line having a first width extending parallel to the first axis between the first location and the second location. Points on the curved surface that are located along one of the perpendicular axes are closer to the first point on first axis than points on the curved surface located at positions other than along one of the perpendicular axes. A distance between a central point on the curved surface along one of the perpendicular axes to the boundary line is a first region depth, and the first width is at least three times the first region depth. A second region further from the first axis than the first region is to the first axis.

In another embodiment, a plasma source coupled to a process chamber is provided. The plasma source includes a core element extending from a first end to a second end along a first axis. The plasma source further includes one or more coils disposed around respective one or more first portions of the core element. The plasma source further includes a plasma block having one or more interior walls at least partially enclosing an annular plasma-generating volume that is disposed around a second portion of the core element. The annular plasma-generating volume includes a first region that surrounds the core element, the first region being symmetrical about a plurality of perpendicular axes that are perpendicular to the first axis at a first point positioned along the first axis. The first region is defined by a curved surface extending from a first location to a second location on one of the interior walls and a boundary line having a first width extending parallel to the first axis between the first location and the second location. Points on the curved surface that are located along one of the perpendicular axes are closer to the first point on first axis than points on the curved surface located at positions other than along one of the perpendicular axes. A distance between a central point on the curved surface along one of the perpendicular axes to the boundary line is a first region depth, wherein the first width is at least three times the first region depth. The annular plasma-generating volume further includes a second region further from the first axis than the first region is to the first axis, wherein the first region and the second region form substantially all of the annular plasma-generating volume.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally provide a plasma source that is able to generate a uniform plasma within a plasma generation region of a plasma source and create a larger processing window in which to process a substrate, without significantly increasing processing or hardware costs.

Figure 1A:
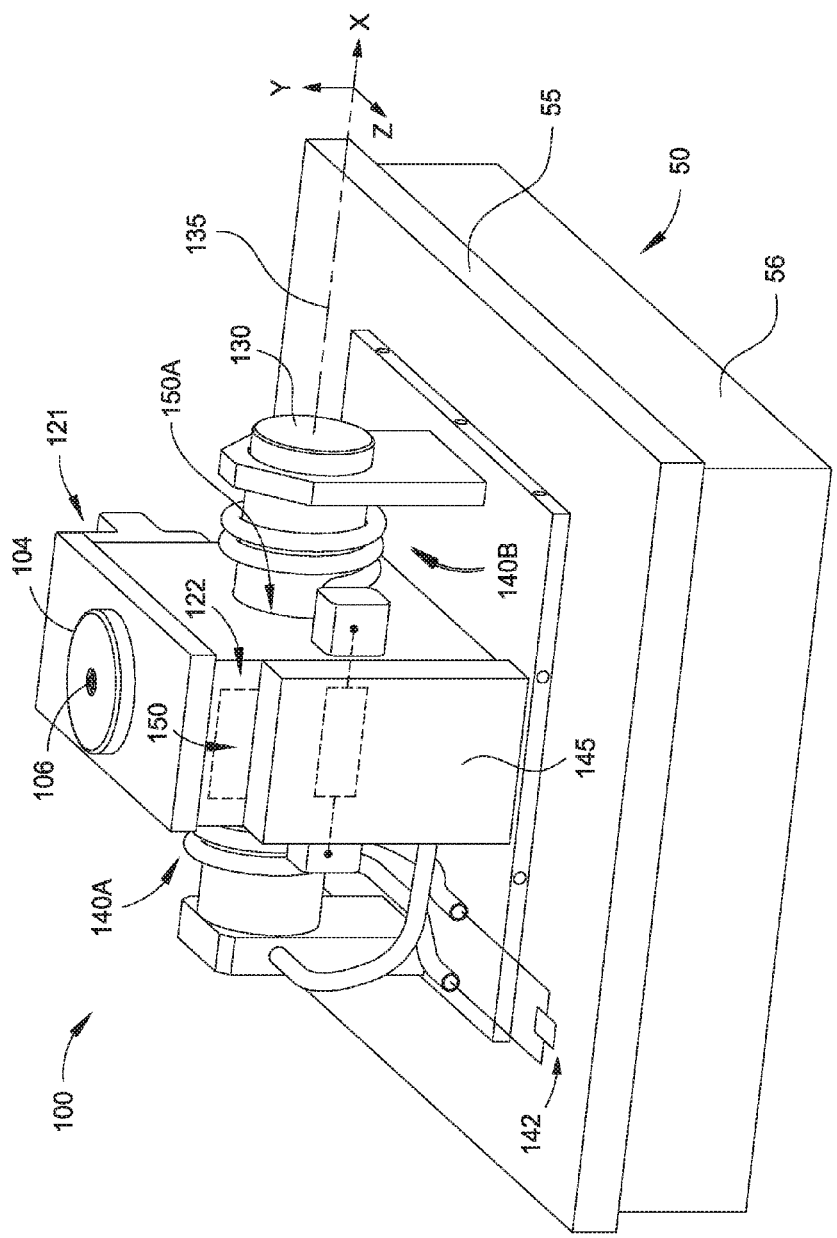
FIG. 1A is an isometric view of a plasma source coupled to a process chamber, according to one embodiment.

FIG. 1A is an isometric view of a plasma source 100 coupled to a process chamber 50, according to one embodiment. The plasma source 100 can be used to supply plasma containing radicals and/or ions to the process chamber 50. The process chamber 50 may include a chamber lid 55 and a chamber body 56 that enclose a processing region 58 (FIG. 1B) in which a substrate resides during processing. The plasma source 100 includes a dome portion 104 coupled to a plasma block 150. The plasma that is supplied to the process chamber 50 can be created in the plasma block 150. Gas that is used to form a plasma may be supplied to the annular plasma-generating volume 158 (FIG. 1B) of the plasma block 150 through a gas inlet 106. Side covers, such as side covers 121, 122, can enclose the annular plasma-generating volume 158 of the plasma block 150. In some embodiments, the side covers 121, 122 also function as cooling plates that are used to regulate the temperature of one or more of the components in the plasma source 100.

The plasma source 100 uses an open loop configuration for creating an inductively coupled plasma. The open loop configuration includes a magnetically permeable core element 130 extending through an opening 150A in the plasma block 150. The core element 130 may have a cylindrical or bar shape. Although the core element 1130 is described here as cylindrical, it is contemplated that the cross-sectional shape of the core element 1130 may be non-circular or non-cylindrical such as square, hexagonal, rectangular, or any other desired shape, either regular or irregular. Coils 140A, 140B can be wrapped around the core element 130 on either side of the plasma block 150 to extend in the X-direction. The coils 140A, 140B generate magnetic fields when power, such as RF power, is supplied to the coils 140A, 140B. FIG. 1A shows the coils 140A, 140 connected to an RF power source 142. In some embodiments, the coils 140A, 140B may be electrically connected through one or more junction boxes, such as a junction box 145 shown in front of the plasma block 150. As shown in FIG. 1A, the core element 130 extends lengthwise along a first axis 135 in the X-direction. Thus, the coils 140A, 140B can generate magnetic fields that are substantially aligned with the X-direction when the magnetic fields pass through the plasma block 150. When the coils 140A, 140B are energized the core element 130 becomes magnetized in the magnetic fields extend around the core element 130 from one end to the opposing end of the core element 130 in the X-direction causing magnetic fields passing through the core element 130 and the annular plasma-generating volume 158 to be aligned substantially in the X-direction. These magnetic fields interact with the gas inside the plasma block 150 to create the plasma. The plasma block 150 includes an annular plasma-generating volume 158 (see FIG. 1B) in which the plasma is created when the coils 140A, 140B are energized.

In one aspect, the core element 130 includes a high magnetic permeability (high-μ) rod or tube, for example, a ferrite rod, but could be other magnetic material depending on the coupling structure. The magnetic material from which the core element 130 is formed will generally have the following characteristics: 1) a low core loss density at high impressed frequencies, 2) have a high Curie temperature, and 3) have a high bulk resistivity. In general, the core element 130 can be formed from any material that can be used to provide a path through which the generated fields (e.g., magnetic fields) created by the flow of RF current through one or more coils (e.g., coil 140A, 140B) will preferentially flow. In one embodiment, the core element 130 includes a ferrite-containing element. While the term "ferrite element" and "ferrite material" are used herein, these terms are not intended to be limiting as to scope of the disclosure. Also, in one embodiment, the core element 130 comprises a bundle of smaller diameter cylinders or rods that are aligned about a center axis, such as the first axis 135, which is coincident with the X-axis shown in FIG. 1A.

To avoid the material compatibility issues found in conventional toroidal or RPS designs, as discussed above, the plasma block 150 (as well as the plasma block 250 described below) is preferentially formed from a material that will not react with the gas radicals or ions formed in the annular plasma-generating volume 158 or with the reactive process gases. In general, the plasma block 150 is formed in a shape that is symmetric about the core element 130 and comprises a material that will not be appreciably attacked by the plasma chemistry and that has a high thermal conductivity to transfer the heat generated by the plasma to a heat exchanging device. In one embodiment, the plasma block 150 comprises a high thermal conductivity dielectric material that is formed to a designated symmetric shape. A plasma block 150 that comprises a solid dielectric material has many advantages over conventional designs, since this type of plasma block avoids the coating defect and possible damage issues commonly found in conventional RPS designs. In some embodiments, the plasma block 150 is made from aluminum oxide ($Al_2O_3$), aluminum nitride (AlN), beryllium oxide (BeO), boron nitride (BN), quartz, or other similar materials. In one embodiment, the plasma block 150 is made from an aluminum nitride material that is about 2 inches thick (i.e., the X-direction in FIG. 1A).

Figure 1B:
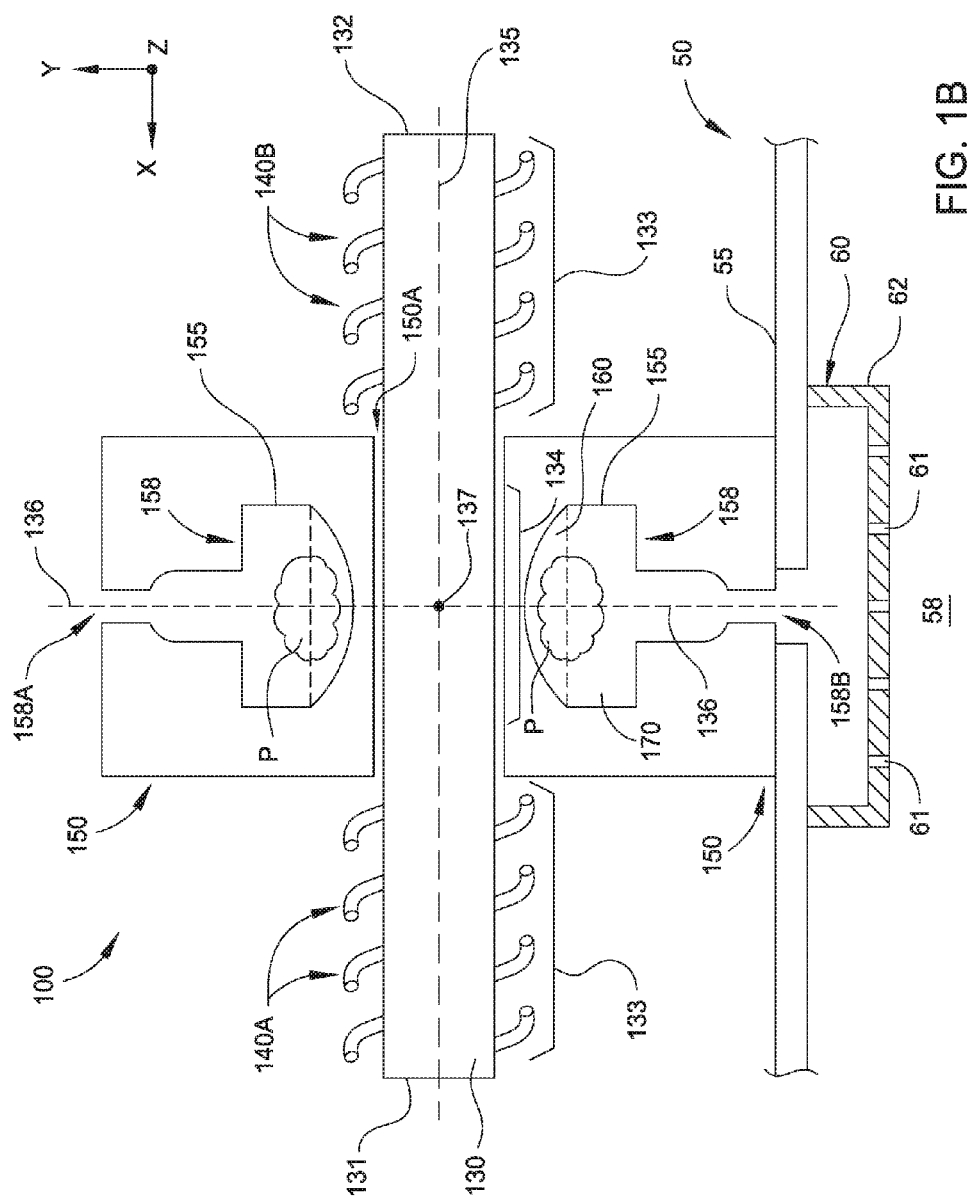
FIG. 1B is a cross-sectional view of the plasma source illustrated in FIG. 1A, according to one embodiment.

FIG. 1B is a cross-sectional view of the plasma source 100 of FIG. 1A, which is formed by cutting the plasma source 100 along an X-Y plane (see FIG. 1A) that passes through the first axis 135 of the core element 130.

As shown, the plasma block 150 includes the annular plasma-generating volume 158 formed therein. The annular plasma-generating volume 158 is generally formed around the core element 130. The annular plasma-generating volume 158 can have a cross-section of a variety of shapes which are described in greater detail below. In some embodiments, the annular plasma-generating volume 158 has a substantially toroidal shape in which a given cross-section of the annular plasma-generating volume is substantially the same 360° around the core element 130.

The core element 130 extends from a first end 131 to a second end 132 along the first axis 135. The first axis 135 can be a central axis of the core element 130. Furthermore, the annular plasma-generating volume 158 may be symmetrically disposed around the first axis 135. For example, the annular plasma-generating volume 158 may have a central axis that is collinear with the first axis 135.

The coils 140A, 140B, can be disposed around respective first portions 133 of the core element 130. The core element 130 is generally disposed through a portion of the plasma block 150 near an interior wall 155 of the plasma block 150. The core element 130 further includes a first point 137 on the first axis 135. The first point 137 may correspond to a center point around which the plasma block 150 and/or the annular plasma-generating volume 158 are disposed. Furthermore, the first point 137 may correspond to a center of the core element 130.

The plasma block 150 includes or more interior walls 155. The one or more interior walls 155 can at least partially enclose and define the annular plasma-generating volume 158. That is the annular plasma-generating volume 158 may be mostly surrounded by interior walls 155, but the plasma block 150 will still generally include openings 158A and 158B to receive gas and to supply plasma to the process chamber 50, respectively. The annular plasma-generating volume 158 is disposed around a second portion 134 of the core element 130.

In some configurations, the annular plasma-generating volume 158 includes a first region 160 that is symmetrical about a plurality of perpendicular axes 136 that are perpendicular to the first axis 135 at the first point 137. These perpendicular axes 136 can be disposed 360° around the first point 137. The plurality of perpendicular axes 136 would all be visible if a cross-sectional view were taken of a Y-Z plane through the first point 137. In the X-Y plane of FIG. 1B only two perpendicular axes 136 are displayed (i.e., one perpendicular axis extending up from the first axis 135 and one perpendicular axis extending down from the first axis 135). The first region 160 of the annular plasma-generating region 158 is a region that is closest to the core element 130. In some embodiments, the first region 160 surrounds the core element 130, and thus extends 360 degrees around the axis 135. In other embodiments the first region 160 is disposed around most of the core element, such as at least 75%, such as at least 90% of the core element 130. The annular plasma-generating volume 158 further includes a second region 170 that is further from the core element 130 than the first region 160. The second region 170 may or may not be symmetrical about the plurality of perpendicular axes 136. In some embodiments, the first region 160 and the second region 170 form substantially all of the annular plasma-generating volume 158, such as at least 90% of the annular plasma-generating volume 158.

Referring to FIG. 1B, in some embodiments, the process chamber 50 includes a baffle plate 60, or showerhead, that is configured to distribute a flow of a process gas received through the opening 158B of the plasma source 100. The baffle plate 60 may contain a plurality of ports 61 that are configured to evenly distribute the flow of process gas to a surface of a substrate (not shown) disposed below the baffle plate 60 in the processing region 58 of the process chamber 50. However, it has been found that the distribution of the plasma formed in the annular plasma-generating volume 158 affects the distribution of radicals and/or plasma provided to the processing region 58 through the baffle plate 60. In other words, it has been found that the plasma distribution in the annular plasma-generating volume 158 affects the plasma or radical concentration that passes through different regions of the baffle plate 60 (e.g., process gas X-Z plane distribution uniformity). Therefore, in some embodiments, there is a need for a plasma source that is able to generate a plasma within a plasma generation region of a plasma source that is better able to provide a more uniform distribution of the process gas to a surface of a substrate disposed in the processing region 58.

Figure 1C:
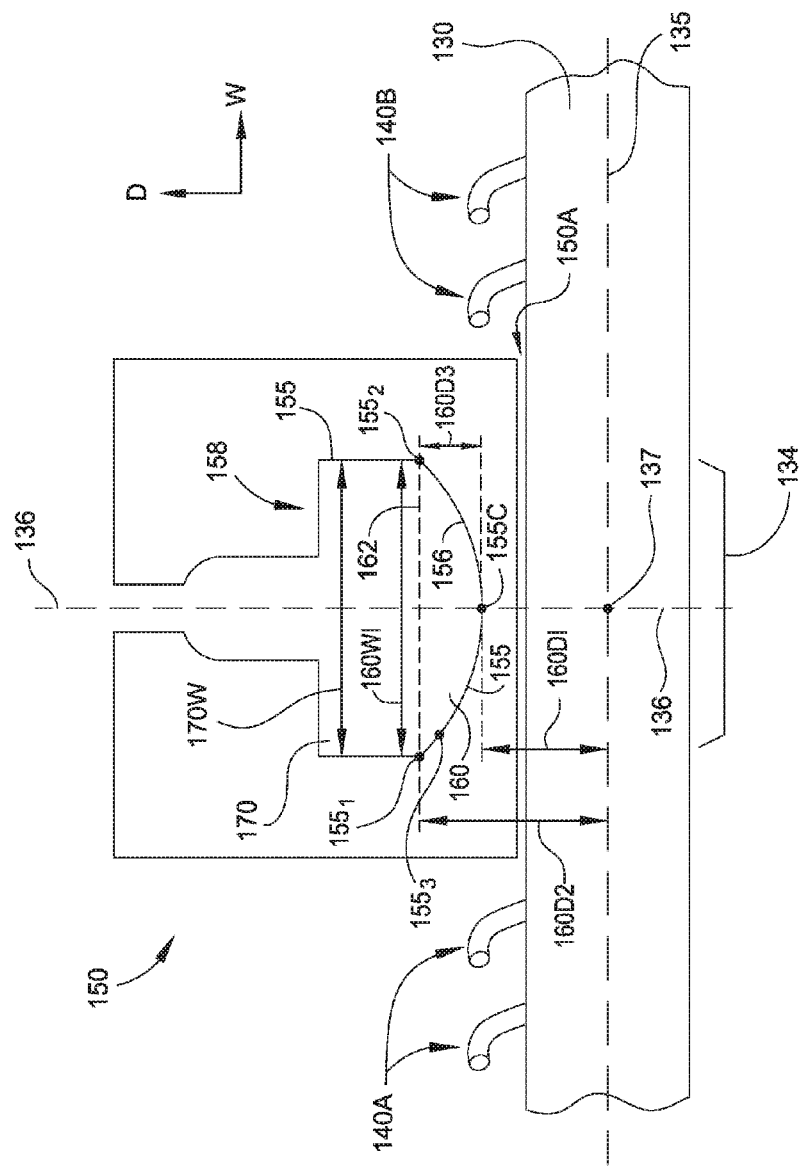
FIG. 1C is a close up view of a portion of the plasma source illustrated in FIG. 1B, according to one embodiment.

FIG. 1C is a close up view of the second portion 134 of the core element 130 and the annular plasma-generating volume 158 above the core element 130 from the view of FIG. 1B. The first region 160 has a width in a direction W parallel to the first axis 135 and a depth in a direction D perpendicular from the first axis 135. The first region 160 further includes a central point 155C located at an intersection of one of the perpendicular axes 136 and an interior wall 155. The central point 155C is a first depth 160D1 from the first point 137 on the first axis 135. The central point 155C is a closest point to the first axis 135 in a given cross-section of the annular plasma-generating volume 158. The width of the first region 160 increases from the width at the central point 155C as the depth from the first point 137 on the first axis 135 increases. Thus, the width of the first region 160 in this embodiment is narrowest at the central point 155C, and is, for example, widest at the second depth 160D2 (i.e., the border between the first region 160 and the second region 170). The first width 160W1 extends between a first location $155_1$ and a second location $155_2$ at opposing points along one or more of the interior walls 155. In embodiments, such as the embodiment shown in FIG. 1C, the first region 160 can be defined by the interior wall 155 closest to the core element 130 having a curved surface 156 and a boundary line 162 that is disposed between the first location $155_1$ and the second location $155_2$ on one or more of the interior walls 155. The boundary line 162 refers to an imaginary line, and does not represent any physical part of the annular plasma-generating volume 158. In some embodiments, the boundary line 162 is a dividing boundary between the first region 160 and the second region 170. In some embodiments, the curved surface 156 contains at least one point, such as the central point 155C, that is closer to the first point 137 on first axis 135 than any of other points on the curved surface 156 that is formed when viewing the curved surface 156 using a cutting plane that contains the first axis 135 (e.g., the X-Y plane shown in FIG. 1B or the W-D plane shown in FIG. 1C).

As discussed above, when the coils 140A, 140B are energized, core element 130 creates magnetic fields that are substantially aligned in the X-direction shown in FIG. 1C as the width direction W. The magnetic fields created by the magnetized core element 130 have a strength that decreases as the distance from the outer surface of the core element 130 increases (i.e., +D-direction). Thus, the strongest magnetic field strength of the magnetic fields that pass through the annular plasma-generating volume 158 are found in the portions of the first region 160 that are closest to the core element 130. Stronger magnetic fields can create higher plasma densities in the annular plasma-generating volume 158 than regions that have weaker magnetic fields. Therefore, the densest plasma in the annular plasma-generating volume 158 is created in the portions of the first region 160 that are closest to the core element 130. As shown in FIG. 1C, the portions of the first region 160 that are closest to the core element 130 are centered about the perpendicular axes 136, and portions of the first region 160 further from the perpendicular axes 136 in the $^+$W and $^-$W-directions are further from the core element 130. Referring to FIG. 1B, the plasma P in the upper part of the plasma block 150 is shown centered in the width direction W to give a clearer understanding of a plasma that is centered in the width direction W.

Annular plasma-generating volumes 158 that have cross-sections in which a central area in the W-direction is not closest to the core element will create a plasma that is not spatially uniform in the W-direction. For example, an annular plasma-generating volume having a rectangular or a rounded rectangular cross-section presents problems creating a spatially uniform plasma. Without being bound by any particular theory, it is thought that the magnetic fields passing through a substantially rectangular cross-section may create denser regions of plasma around the corners of the substantially rectangular cross-section while creating less dense plasma in the center of the substantially rectangular cross-section in the W-direction. When the plasma does not have a density distribution that is centered in the W-direction (e.g., across the first width 160W1) in the plasma-generating volume, it is difficult to supply a spatially uniform plasma to the process chamber.

Figure 4:
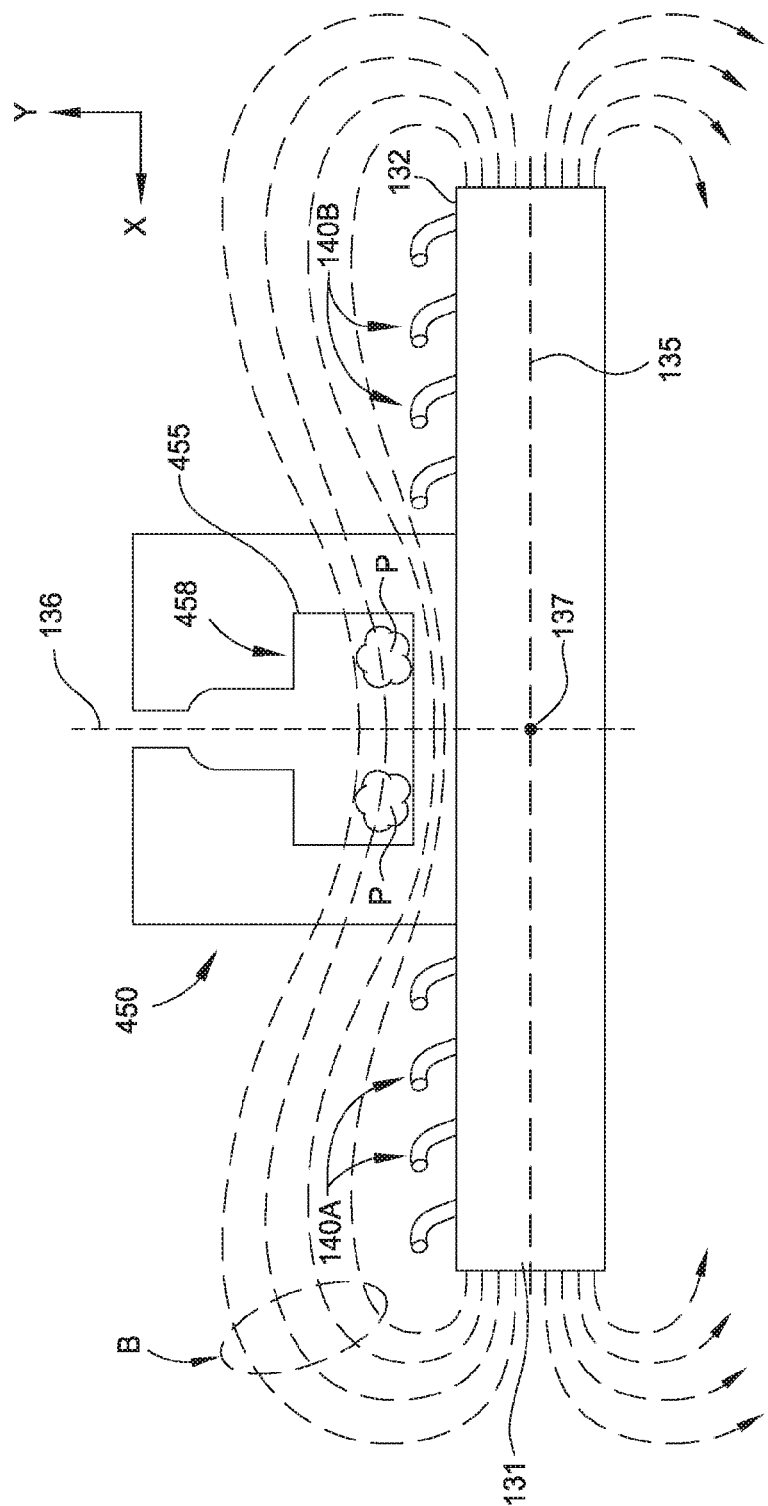
FIG. 4 is a cross sectional view of a plasma block, according to a comparative embodiment.

For example, FIG. 4 shows a plasma block 450 having interior walls 455 enclosing a plasma-generating volume 458 that has a rectangular cross-section. As shown in FIG. 4, the plasma P is formed with higher densities in some of the corners of the plasma-generating volume 458 having a rectangular cross-section due to any form of non-symmetry coming from thermal, Electro-magnetic field, etc. in these regions. It is believed that a thermal or electro-magnetic field strength asymmetry, such as the asymmetry of the magnetic field lines "B," will make plasma latch to either one of the corners during strike and sustaining of plasma. Since this is an open loop type plasma source design, having electro-magnetic field constant throughout plasma block is challenging which can lead to plasma skew in the plasma block 450. In other words, a significant portion of the generated magnetic field lines "B" will tend to constrict and pass through the opening 150A (See FIGS. 1A and 1C) and corners of the plasma-generating volume 458 within the lower portion of the plasma block 450, rather than pass directly through or around the outside of the plasma block 450. Having a plasma with denser regions in the outside corners of the plasma-generating volume 458 results in the plasma or radical concentration provided to the process chamber through the outlet (e.g., opening 158B (FIG. 1B)) being similarly skewed (e.g., outer edges), which prevents uniform and consistent processing of substrates.

In some embodiments, such as the embodiment of FIG. 1C, the second region 170 may have a second width 170W parallel to the first axis 135, where the second width 170W is substantially constant in a direction perpendicular to the first axis 135 (i.e., the depth direction D). In other embodiments the second region may a varying width in the depth direction D, such as the embodiment described in reference to FIG. 2.

The first width 160W1 is parallel to the first axis 135. The first width 160W1 may be the widest width of the first region 160. The first width 160W1 can also be at a location of an outer boundary of the first region 160. The first width 160W1 is located at a second depth 160D2 from the first point 137 in the D-direction. In some embodiments, such as the embodiment shown in FIG. 1C, as the width W of the first region 160 increases from the central point 155C a tangent to the surface 156 in the W-D plane will have a varying slope, such as a constantly varying slope (i.e., a curved surface) as the depth of the first region 160 from the first axis 135 increases in the D-direction. The depth of the first region 160 is a third depth 160D3 that spans a distance between the second depth 160D2 and the first depth 160D1. In some embodiments, the first width 160W1 is at least three times greater than the third depth 160D3. In other embodiments, the first width 160W1 is at least five times greater than the third depth 160D3. In some embodiments, the first region 160 has a volume of at least one third of the annular plasma-generating volume 158. Although sharp corners are shown in annular plasma-generating regions (e.g., annular plasma-generating region 158) of FIGS. 1 through 3, there could be a fillet radius or chamfer to avoid any high stress concentrations.

The depth of the first region 160 may also be described as a first region depth (the same as the third depth 160D3), which is a distance between the central point 155C on the curved surface 156 along one of the perpendicular axes 136 to the boundary line 162. In some embodiment, the first width 160W1 can be at least three times the first region depth. In other embodiments, the first width 160W1 can be at least five times the first region depth.

Having the width (W-direction) of the first region 160 (i.e., the closest region of annular plasma generating volume to the core element, where the first region has a width that increases as distance from the core element increases) be substantially longer than the depth (D-direction) of the first region 160 prevents the plasma created in the annular plasma-generating volume 158 from being confined to an overly narrow portion of the annular plasma-generating volume 158. As discussed above, the strength of the magnetic fields generated by the core element 130 decrease as distance from the core element 130 increases. Thus, having an annular plasma-generating volume with a cross-section with a closest region (e.g., first region 160) that has a width (e.g., first width 160W1 of FIG. 1C) that is greater than its depth (e.g., third depth 160D3 of FIG. 1C) allows a larger volume as well as a more centered volume of gas to interact with the stronger magnetic fields that are closest to the core element 130 when compared to a cross-section having a first region (i.e., a closest region of annular plasma generating volume to the core element, where the first region has a width that increases as distance from the core element increases) that has a width that has a length that is shorter or equal to its depth. When the width of the cross-section is less than or equal to the depth of the cross-section, the plasma generation process becomes inefficient and too much of the plasma is confined to a narrow region closest to the core element 130. Thus, it is believed that an annular plasma-generating volume having a substantially circular cross-section (i.e., in which the width is substantially equal to the depth) produces a plasma confined to an overly narrow region of the annular plasma-generating volume.

Figure 2:
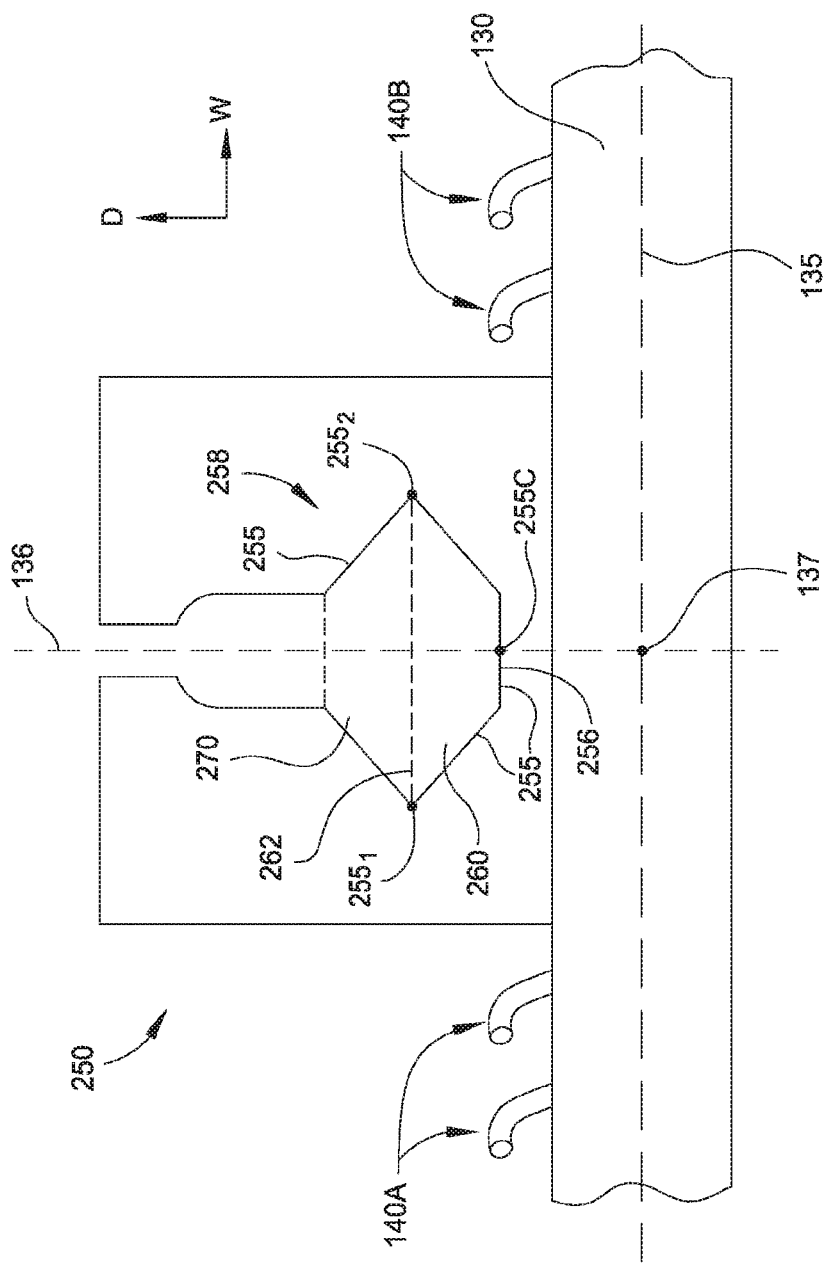
FIG. 2 is a close up view of a portion of a plasma source, according to another embodiment.

FIG. 2 is a close up view of an alternative embodiment of an annular plasma-generating volume 258 in a plasma block 250 that is disposed over the second portion 134 of the core element 130. The annular plasma-generating volume 258 is generally formed around the core element 130. The annular plasma-generating volume 258 can surround the core element 130 in some embodiments, and thus extends 360 degrees around the axis 135. The plasma block 250 includes interior walls 255. One of the perpendicular axes 136 (i.e., the perpendicular axis 136 that extends up from the first axis 135 in the X-Y plane), which is perpendicular to the first axis 135 at the first point 137, may intersect a central point 255C of the interior wall 255 that is closest to the first axis 135. If a Y-Z plane through the first point 137 of the first axis 135 was viewed (i.e., the plane that would show the complete ring of the annular plasma-generating volume 258), then each perpendicular axis 136 would intersect a central point on an interior wall 255, such as point 255C, that are closer to the first point 137 on the first axis 135 than points on the interior wall 255 that are not located along of the perpendicular axes 136.

The annular plasma-generating volume 258 includes a first region 260 and a second region 270. The first region 260 of the annular plasma-generating volume 258 is a region that is closest to the core element 130. The second region 270 is further from the core element 130 than the first region 260 is to the core element 130. The first region 260 is symmetrical about the plurality of perpendicular axes 136 that are perpendicular to the first axis 135 at the first point 137. The cross-section of the second region 270 in the W-D plane may also be symmetrical about the perpendicular axes 136. The first region 260 has a width in a direction W parallel to the first axis 135 and a depth in a direction D perpendicular from the first axis 135. The width of the first region 260 increases as the depth in the D-direction increases (i.e., the direction from the first point 137 on the first axis 135 along one of the perpendicular axes 136). The width of the first region 260 may increase with a constant slope as the depth from the first point 137 on the first axis 135 increases. In some embodiments, such as the embodiment of FIG. 2, the second region 270 may be a mirror image of the first region 260. The first region 260 borders the second region at a boundary line 262. The boundary line 262 refers to an imaginary line and does not represent any physical part of the annular plasma-generating volume 258. The boundary line 262 can extend across the annular plasma-generating volume 258 from a first point $255_1$ on one interior wall 255 to a second point $255_2$ on another interior wall 255. The boundary line 262 can be at a location of a widest width of the first region 260 and the second region 270. The width of the second region 270 may decrease with a constant slope as the depth from the first point 137 on the first axis 135 increases.

The interior wall 256 that is closest to the core element 130 may be parallel to the core element 130. The length of the wall 256 in the W direction should be substantially shorter than the width of the first region 260 (i.e., the distance between the first point $255_1$ and the second point $255_2$) to prevent a plasma generated in the first region from being skewed in the width direction W. Further details on how a plasma can become skewed in the width direction are discussed in reference to FIG. 4 above. In other embodiments, two interior walls may meet at points along the perpendicular axes 136, so that the width of the first region approaches zero in portions of the first region that are closest to the core element 130. Having a width of a first region that approaches zero in portions of the first region that are closest to the core element 130 can help to ensure a plasma generated in the first region is centered and uniformly distributed in the width direction W.

The annular plasma-generating volumes 158, 258 discussed above show two embodiments that can improve the spatial uniformity of the plasma supplied to a process chamber through a port, such as opening 158B shown in FIG. 1B. Each annular plasma-generating volume 158, 258 has a first region that is closest to the core element, where the first region has a width that increases as a distance from the core element increases. Having a width that increases as distance from the core element increases allows the plasma generated in the first region to be centered in the annular plasma generated region (i.e. centered along one of the perpendicular axes from the axis of the core element). Furthermore, each annular plasma-generating volume 158, 258 has a first region with a width that is longer (i.e., greater in magnitude) than the depth, such as at least three times as long as the depth of the first region, which allows a large and broad volume of gas in the annular plasma-generating volume to interact with the strongest magnetic fields from the core element to create the plasma. Other annular plasma-generating volumes are also contemplated. For example, an annular plasma-generating volume may include a first region that includes a cross-sectional shape where two substantially straight interior walls meet at a point that intersects at a perpendicular axis extending from a central point, such as the first point 137 on the first axis 135 of the core element 130, as discussed above. Furthermore, various features of the embodiments discussed above may be combined or rearranged with other features discussed above. For example, an embodiment having a first region with a curved surface such as curved surface 156 could have a second region that is substantially a mirror image of the first region similar to how the first and second regions of the embodiment displayed in FIG. 2 were mirror images. Also, some embodiments may have a first region that includes curved interior walls as well as straight interior walls.

Dual Plasma Block Design

Figure 3:
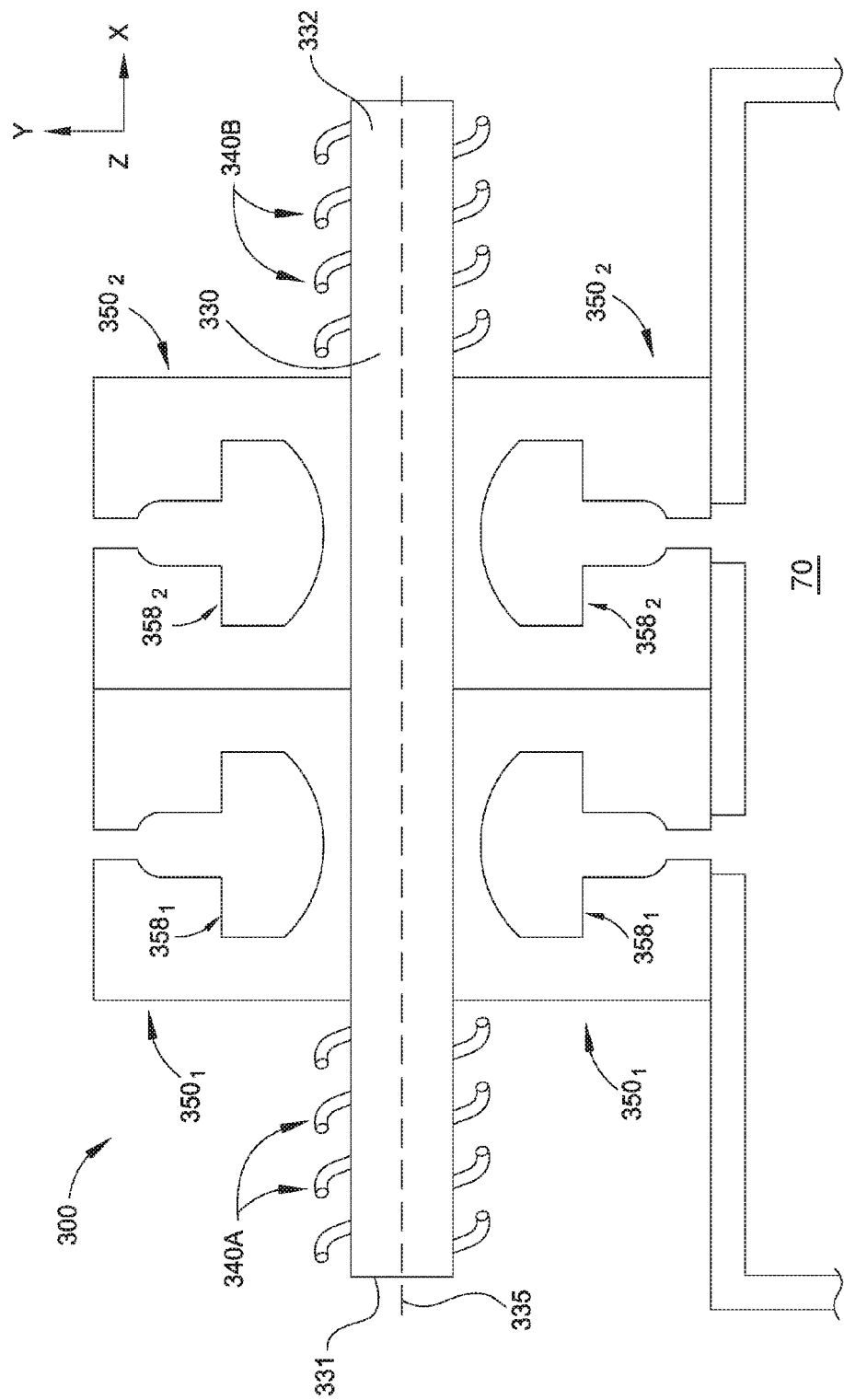
FIG. 3 is a cross-sectional view of a plasma source, according to another embodiment.

FIG. 3 is a cross-sectional view of a plasma source 300, according to another embodiment. The plasma source 300 includes two plasma blocks $350_1$, $350_2$. The plasma blocks $350_1$, $350_2$ are coupled to a process chamber 70, which may be similar or the same as the process chamber 50 discussed above.

As shown, each plasma block $350_1$, $350_2$ includes an annular plasma-generating volume $358_1$, $358_2$ formed therein. In some embodiments, the plasma blocks $350_1$, $350_2$ can be positioned to abut each other in the X-direction. In other embodiments, a space may be included between the plasma blocks $350_1$, $350_2$. A magnetically permeable core element 330 similar to the core element 130 can extend through the plasma blocks 350₁, 350₂. The core element 330 extends from a first end 331 to a second end 332 along a first axis 335 in the X-direction. Coils 340A, 340B can be wrapped around the core element 330 on either side of the plasma blocks 350₁, 350₂ to extend in the X-direction. If a space is included between the plasma blocks 350₁, 350₂ then another coil 340C (not shown) may be wrapped around the core element 330 between the plasma blocks 350₁, 350₂.

Plasma source 300 can be used in different ways to improve consistency and uniformity when processing substrates, such as semiconductor substrates. One benefit that plasma source 300 can provide is enabled by dedicating one of the plasma blocks 350₁, 350₂ to a specific function. For example, the plasma block 350₁ can be dedicated to be used during deposition steps, and the plasma block 350₂ can be dedicated to be used during cleaning steps. Dedicating the plasma block 350₂ to be used during cleaning steps prevents the harsh materials, such as fluorine gases, from entering the annular plasma-generating volume 358₁ of the plasma block 350₁. Harsh cleaning materials, such as fluorine gases, can begin to erode materials from the interior walls of an annular plasma generating volume, such as annular plasma-generating volume 358₁. This erosion can alter the characteristics of a plasma created within the annular plasma-generating volume 358₁ causing inconsistent and non-uniform results during processes, such as depositions, despite holding other inputs constant.

Another benefit from plasma source 300 occurs during simultaneous use of the plasma blocks 350₁, 350₂. Because the plasma source 300 includes only one core element 330, there is only one set of coils and one magnetic permeable object (i.e., the core element 330) creating the magnetic fields that generate the plasma in the plasma blocks 350₁, 350₂. Previous designs using two or more plasma blocks included two or more core elements, each core element having a separate set of coils. Thus, these previous designs included a separate plasma source for each plasma block. In these previous designs, the magnetic fields generated by one plasma source would begin to influence the plasma generated in the other plasma source. For example in these previous designs, for a process chamber that can process two substrates simultaneously, a plasma source could be dedicated to opposing sides of the process chamber so that each plasma source code provide the plasma for a specific substrate in the process chamber. However, this previous design inevitably results in each plasma source influencing the process being performed on both substrates, creating crosstalk between the two plasma sources and preventing control of the process performed on a substrate. Conversely, in the plasma source 300 there is only one core element 330 having one set of coils 340A, 340B for the two plasma blocks 350, 350, which eliminates the possibility of a crosstalk situation.

While the foregoing is directed to embodiments of the present disclosure, other and further embodiments of the disclosure may be devised without departing from the basic scope thereof, and the scope thereof is determined by the claims that follow.

The invention claimed is:

1. A plasma source coupled to a process chamber, the plasma source comprising:
    a core element extending from a first end to a second end along a first axis;
    one or more coils disposed around respective one or more first portions of the core element; and
    a plasma block having one or more interior walls at least partially enclosing an annular plasma-generating volume that is disposed around a second portion of the core element, the annular plasma-generating volume comprising:
        a first region that is symmetrical about a plurality of perpendicular axes that are perpendicular to the first axis at a first point positioned along the first axis, the first region having:
            a width in a direction parallel to the first axis and a depth in a direction perpendicular from the first axis, wherein the width in the first region increases as the depth from the first point positioned on the first axis increases;
            a central point located at an intersection of one of the perpendicular axes and an interior wall, wherein the central point is a first depth from the first point positioned on the first axis;
            a first width between a first location and a second location on one or more of the interior walls, wherein the first width is parallel to the first axis and the first width is a second depth from the first point positioned on the first axis; and
            a third depth spanning a distance between the second depth and the first depth, wherein the first width is at least three times greater than the third depth.

2. The plasma source of claim 1, wherein the first width is at least five times greater than the third depth.

3. The plasma source of claim 1, wherein the width of the first region increases with a constant slope as the depth of the first region increases.

4. The plasma source of claim 3, wherein the annular plasma-generating volume further comprises a second region that is further from the core element than the first region is to the core element.

5. The plasma source of claim 4, wherein the first region and the second region form substantially all of the annular plasma-generating volume.

6. The plasma source of claim 5, wherein the second region is a mirror image of the first region.

7. The plasma source of claim 1, wherein the width of the first region increases with a constantly varying slope as the depth of the first region increases.

8. The plasma source of claim 1, wherein the first region is defined by a curved surface on one of the interior walls and a boundary line between the first location and the second location on one or more of the interior walls.

9. The plasma source of claim 1, wherein the annular plasma-generating volume is disposed around a central axis that is collinear with the first axis.

10. The plasma source of claim 1, wherein the first region surrounds the core element.

11. The plasma source of claim 10, wherein the first region comprises a volume of at least one third of the annular plasma-generating volume.

12. The plasma source of claim 1, wherein the annular plasma-generating volume further comprises a second region that is further from the core element than the first region is to the core element and a second width of the second region parallel to the first axis is substantially constant in a direction perpendicular to the first axis.

13. A plasma source coupled to a process chamber, the plasma source comprising:
    a core element extending from a first end to a second end along a first axis;
    one or more coils disposed around respective one or more first portions of the core element; and
    a plasma block having one or more interior walls at least partially enclosing an annular plasma-generating volume that is disposed around a second portion of the core element, the annular plasma-generating volume comprising:
a first region that is symmetrical about a plurality of perpendicular axes that are perpendicular to the first axis at a first point positioned along the first axis, the first region having a width in a direction parallel to the first axis and a depth in a direction perpendicular from the first axis wherein:
the first region is defined by a curved surface extending from a first location to a second location on one of the interior walls and a boundary line having a first width extending parallel to the first axis between the first location and the second location;
points on the curved surface that are located along one of the perpendicular axes are closer to the first point on first axis than points on the curved surface located at positions other than along one of the perpendicular axes;
a distance between a central point on the curved surface along one of the perpendicular axes to the boundary line is a first region depth, wherein the first width is at least three times the first region depth; and
a second region further from the first axis than the first region is to the first axis.

14. The plasma source of claim 13, wherein the first width is at least five times greater than the first region depth.

15. The plasma source of claim 14, wherein the second region borders the first region.

16. The plasma source of claim 13, wherein the first region surrounds the core element.

17. The plasma source of claim 16, wherein the first region comprises a volume of at least one third of the annular plasma-generating volume.

18. The plasma source of claim 17, wherein the annular plasma-generating volume is disposed around a central axis that is collinear with the first axis.

19. The plasma source of claim 13, wherein the core element has a cylindrical shape.

20. A plasma source coupled to a process chamber, the plasma source comprising:
a core element extending from a first end to a second end along a first axis;
one or more coils disposed around respective one or more first portions of the core element; and
a plasma block having one or more interior walls at least partially enclosing an annular plasma-generating volume that is disposed around a second portion of the core element, the annular plasma-generating volume comprising:
a first region that surrounds the core element, the first region being symmetrical about a plurality of perpendicular axes that are perpendicular to the first axis at a first point positioned along the first axis, wherein:
the first region is defined by a curved surface extending from a first location to a second location on one of the interior walls and a boundary line having a first width extending parallel to the first axis between the first location and the second location;
points on the curved surface that are located along one of the perpendicular axes are closer to the first point on first axis than points on the curved surface located at positions other than along one of the perpendicular axes;
a distance between a central point on the curved surface along one of the perpendicular axes to the boundary line is a first region depth, wherein the first width is at least three times the first region depth; and
a second region further from the first axis than the first region is to the first axis, wherein the first region and the second region form substantially all of the annular plasma-generating volume.

* * * * *